United States Patent
Sirichotiyakul et al.

(10) Patent No.: US 7,149,674 B1
(45) Date of Patent: Dec. 12, 2006

(54) METHODS FOR ANALYZING INTEGRATED CIRCUITS AND APPARATUS THEREFOR

(75) Inventors: Supamas Sirichotiyakul, Austin, TX (US); David T. Blaauw, Austin, TX (US); Timothy J. Edwards, Austin, TX (US); Chanhee Oh, Cibolo, TX (US); Rajendran V. Panda, Round Rock, TX (US); Judah L. Adelman, Shimshon (IL); David Moshe, Haifa (IL); Abhijit Dharchoudhury, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1255 days.

(21) Appl. No.: 09/580,854

(22) Filed: May 30, 2000

(51) Int. Cl.
 *G06F 17/50* (2006.01)

(52) U.S. Cl. .................. 703/15; 716/2; 716/6; 716/11; 327/534

(58) Field of Classification Search .............. 716/2, 716/4, 6, 11; 327/149, 534; 326/58, 93; 257/408, 510, 369; 703/14, 15, 16; 358/1.15
See application file for complete search history.

(56) References Cited

U.S. PATENT DOCUMENTS

| | | | |
|---|---|---|---|
| 5,751,593 A * | 5/1998 | Pullela et al. ................. | 716/6 |
| 5,774,367 A * | 6/1998 | Reyes et al. ................... | 716/2 |
| 5,831,451 A * | 11/1998 | Bosshart ....................... | 326/93 |
| 6,097,241 A * | 8/2000 | Bertin et al. ................. | 327/534 |
| 6,169,419 B1 * | 1/2001 | De et al. ...................... | 326/58 |
| 6,175,949 B1 * | 1/2001 | Gristede et al. .............. | 716/11 |
| 6,300,819 B1 * | 10/2001 | De et al. ..................... | 327/534 |
| 6,608,509 B1 * | 8/2003 | Mizuno et al. ............ | 327/149 |

OTHER PUBLICATIONS

Sundararajan et al., "Low power synthesis of dual threshold voltage CMOS VLSI circuits", ACM 1999.*
Sirichotiyakul et al. "Stand-by power minimization through simultaneous threshold voltage selection and circuit sizing", ACM 1999.*

* cited by examiner

*Primary Examiner*—Paul L. Rodriguez
*Assistant Examiner*—Kandasamy Thangavelu
(74) *Attorney, Agent, or Firm*—Joanna G. Chiu

(57) ABSTRACT

A method of improving performance of a dual $V_t$ integrated circuit is disclosed in which a first value is calculated for each transistor of the integrated circuit that has a first threshold voltage level. The first value is based at least in part on delay and leakage of the circuit calculated as if the corresponding transistor had a second threshold voltage level. One transistor is then selected based on the first values. The threshold voltage of the selected transistor is then set to the second threshold voltage level. The area of at least one transistor within the circuit is modified, and the circuit is then sized to a predetermined area. The process may then be repeated if the circuit performance fails to meet a defined constraint. In one embodiment, the performance determination includes calculating the leakage current of a set of DC-connected components into which the circuit is partitioned, determining dominant logic states for each of the components, estimating the leakage of each of these dominant logic states, and summing the weighted averages of these dominant components based on state probabilities.

43 Claims, 5 Drawing Sheets

FIG.5A  FIG.5B

| STATE (ABC) | LEAKAGE (NA) | LEAKING TRANSISTORS |
|---|---|---|
| 000 | 0.095 | N1, N2, N3 |
| 001 | 0.195 | N1, N2 |
| 010 | 0.195 | N1, N3 |
| 011 | 1.874 | N1 |
| 100 | 0.185 | N2, N3 |
| 101 | 1.220 | N2 |
| 110 | 1.140 | N3 |
| 111 | 9.410 | P1, P2, P3 |

$S = \{V_{DD}\},$
$\{V_{DD}, X\},$
$\{V_{DD}, X, Y\},$
$\{V_{DD}, X, Y, Z\},$ $S = \{V_{DD}, X, Y\}$
$A = 0$ $AB = 01$ $ABC = 01X$

METHODS FOR ANALYZING INTEGRATED CIRCUITS AND APPARATUS THEREFOR

FIELD OF THE INVENTION

The present invention is related to the field of integrated circuit design and more particularly to methods for analyzing integrated circuits.

RELATED ART

Increasing demand for portable and other wireless devices has created a greater need for circuits with very low stand-by leakage current. Typically, lower power is achieved through the use of lower supply voltages. Due to this lower supply voltage, power conscious designers have begun to utilize dual threshold voltage ($V_t$) transistor designs. In a dual $V_t$ circuit, transistors can have either a high or low threshold voltage characteristic. Low $V_t$ devices have approximately twice the switching speed of high $V_t$ devices, but they contribute a leakage power that is several orders of magnitude higher along with a slightly higher capacitance. In order to meet both the leakage and performance requirements of portable devices, a mixture of low and high $V_t$ devices can be used. Unfortunately, conventional design methodologies cannot provide a method for determining which of the transistors in an integrated circuit will be designed as low $V_t$ devices and which will be designed as high $V_t$ devices. It is highly desirable to implement a method for automatically selecting an optimal $V_t$ mixture such that all design constraints are met.

Another issue in designing a circuit for portable devices and in performing leakage current optimization is efficiently determining an accurate leakage current of the circuit. Leakage current analysis is complicated due to the highly non-linear behavior of the drain current of a device with respect to source/drain voltages. Several simple models for subthreshold operation have been in use, but they do not provide good accuracy. Also, SPICE-like simulation using non-linear models can be used to obtain leakage current estimates, but it is very computationally expensive, and becomes infeasible for evaluation of large circuits.

BRIEF DESCRIPTION OF THE DRAWINGS

The present invention is illustrated by way of example and not limitation in the accompanying figures, in which like references indicate similar elements, and in which:

FIGS. 5A and 5B illustrate a three input NAND gate and a graphical representation of the NAND gate;

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally speaking, embodiments of the present invention contemplate methods of improving integrated circuit performance. More specifically, performance is improved in one embodiment of the invention by optimizing the mix and size of transistors having a first threshold voltage ($V_t$) and transistors having a second $V_t$ in an integrated circuit fabricated with a dual $V_t$ fabrication process. (For purposes of this invention, a dual $V_t$ process refers to a process that produces dual n-channel $V_t$'s as well as dual p-channel $V_t$'s). In some embodiments of the invention, one or more of the methods described below may be implemented as computer software in which computer executable instructions are encoded on a computer readable medium. Typically, the computer readable medium is a storage device or memory facility such as a floppy diskette, CD-ROM, DVD, hard diskette, or a ROM or RAM device.

Figure 1:
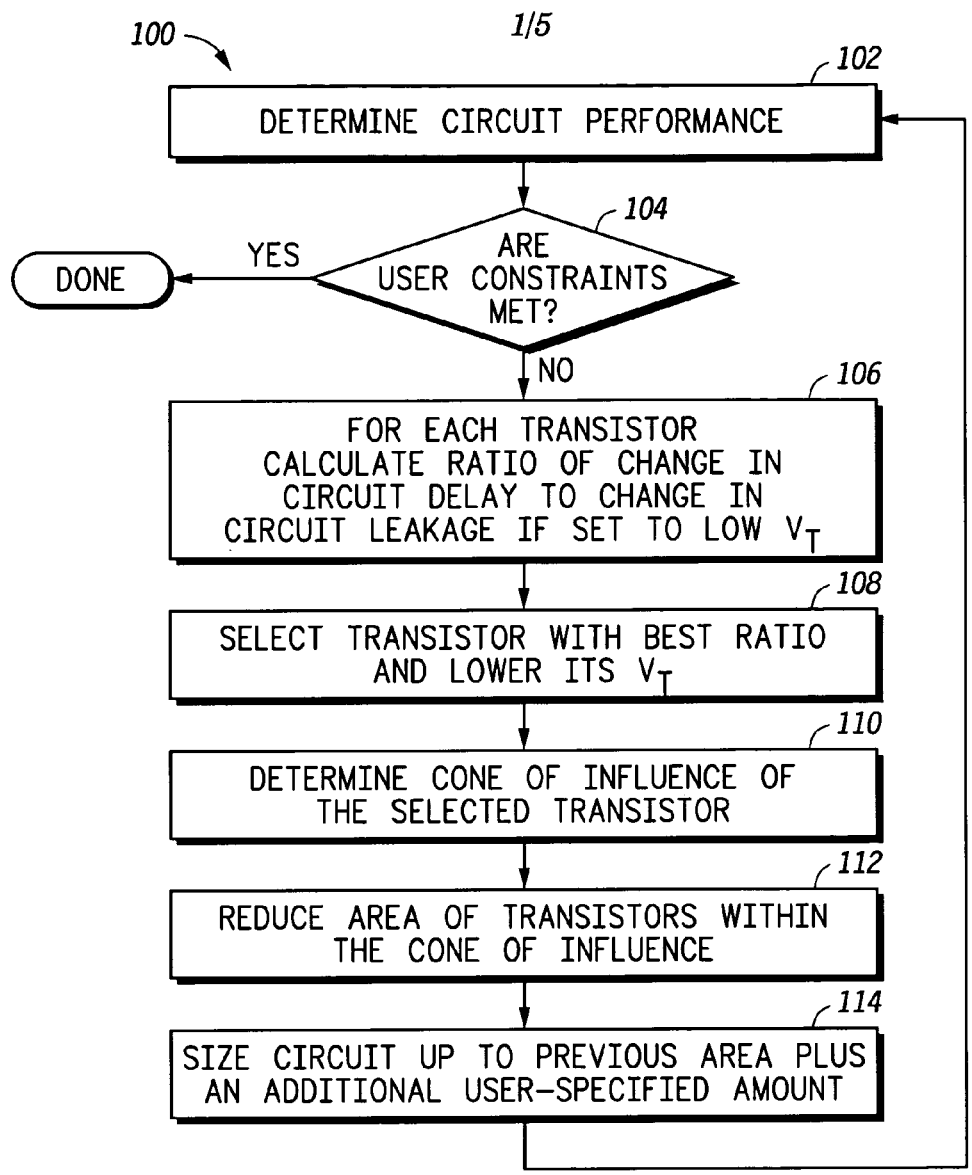
FIG. 1 is a flow diagram of a method for selecting threshold voltages for transistors within an integrated circuit.

Referring to FIG. 1, a method 100 of improving the performance of an integrated circuit according to one embodiment of the invention is illustrated. In the depicted method, it is assumed that a circuit model, such as a hardware description language (HDL) model, exists for the circuit under consideration. In the existing circuit model, some of the transistors may be high $V_t$ transistors and others may be low $V_t$ transistors. In one embodiment, high $V_t$ transistors may refer to those having a $V_t$ of approximately 0.48 Volts, while low $V_t$ transistors may refer to those having a $V_t$ of approximately 0.33 Volts. Alternate embodiments may use different $V_t$ values where a high $V_t$ refers to a $V_t$ that is high relative to the low $V_t$.

The performance of the circuit is determined in block 102 using any of a variety of simulation or analysis tools. Typically, performance is characterized by one or more metrics such as the speed at which the integrated circuit operates and the standby currents of the circuit. The determined performance is then compared to a set of predetermined constraints in block 104. These performance constraints may include maximum die size constraints, maximum delay constraints, and maximum standby current constraints. If the constraints are met, no additional modifications or refinements of the circuit are required and the method is terminated. If one or more constraints are not met, however, the optimization flow is continued.

The embodiments described herein can also be applied to the circuit where the constraints are already met. In such case, the performance is further improved and the optimization flow terminates when no more improvement can be obtained for the circuit.

After the performance of the circuit model is determined, an iterative process is initiated in which at least one transistor in the circuit model is selected and modified from a transistor with the first $V_t$ to a transistor with the second $V_t$.

In one embodiment, for example, the initial circuit is implemented with a total area (sum of all transistor widths) equal to a predetermined area constraint, assuming all transistors are fabricated as high $V_t$ transistors. In this example, at least one of the high $V_t$ transistors would be changed to a low $V_t$ transistor. After altering the $V_t$ of one or more of the transistors, a value is calculated. The value is typically based at least in part on circuit delay (speed) and leakage (standby current) obtained with the modified circuit (i.e., the circuit containing the one or more low $V_t$ transistors).

For the embodiment depicted in FIG. 1, the calculated value (as shown in block 106) indicates the ratio of change in delay ($\Delta T$) to the change in circuit leakage ($\Delta I$) obtained by lowering the $V_t$ of a particular transistor in the circuit model. A relatively high ratio would indicate that a relatively large decrease in delay was obtained for a relatively modest increase in leakage. Block 106 may be repeated for each transistor in the circuit model (or subset of the circuit model), thereby resulting in the generation of a set of values. Each value indicates the cost/benefit ratio of implementing a corresponding transistor in the circuit model as a low $V_t$ transistor (where the cost of a lower $V_t$ is increased leakage current and the benefit is reduced circuit delay). In block 108, the set of values generated in block 106 is used to select the transistor (or transistors) that provides the best cost/benefit ratio (e.g., the transistor with the largest $\Delta T/\Delta I$ ratio). The $V_t$ of the selected transistor is then set in the circuit model to the second (lower) $V_t$ level.

After the $V_t$ of a selected transistor is set to the second $V_t$ level in block 108, the depicted embodiment of method 100 resizes one or more transistors affected by the $V_t$ shift of the selected transistor. Obtaining maximum tradeoff between speed and leakage of a design requires simultaneous adjustment of device sizes and threshold voltages. If, in a well-balanced circuit, the $V_t$ of a transistor on the critical path is lowered while keeping the transistor sizes fixed, the path will become unduly fast, thereby making the size suboptimal. In addition, the gate capacitance of a transistor increases by approximately 8–10% as its $V_t$ is lowered from 0.48 V to 0.33 V, thereby slowing other paths passing through this transistor's gate node. Setting a transistor to low $V_t$ without subsequently adjusting transistor sizes in the circuit can actually degrade the performance of the circuit while increasing leakage.

Optimization of transistor sizing following a $V_t$ modification in one embodiment of the invention includes determining (in block 110) the transistors within a "cone of influence" of the selected transistor (the transistor whose $V_t$ was altered in block 108). The cone of influence of a selected transistor may include all transistors within a specified number of stages of the selected transistor. If, for example, it is theorized that lowering the $V_t$ of a selected transistor has a negligible effect on transistors that are more than four stages removed from the selected transistor, the cone of influence is four stages. Under this assumption, all transistors within four stages of the selected transistor are within the selected transistor's cone of influence. Typically, the depth of the cone of influence (i.e., the number of stages in the cone of influence) is a function of the change in threshold voltage and is typically less than or equal to four stages. After determining the transistors included within a selected transistor's cone of influence, the area of these transistors may then be reduced in block 112. A linear reduction gradient or other suitable tool may be employed to reduce the area of transistors in a given cone of influence in an automated fashion.

Alternate embodiments may use other methods for selecting transistors within the circuit to be reduced. For example, methods other than defining a cone of influence may be used to determine those transistors affected by the $V_t$-lowering of the selected transistor. Therefore, alternate methods may define larger or smaller regions of transistors that are affected, depending on the performance needs of the circuit.

Following the area reduction achieved in block 112, the circuit (as a whole) is then resized in block 114 to redistribute the area saved by the area reduction of block 112 in order to decrease the worst case delay in the circuit. In an embodiment in which the circuit must conform to a predetermined area, the re-sizing of the circuit in block 114 restores the circuit to the previous area (i.e., the area of the device prior to block 112). In an embodiment where there is not a predetermined total area constraint, the resizing of block 114 may restore the area of the circuit to the previous area plus an additional amount specified by the user to achieve even more improved performance and further balance path delays in the circuit. The resizing of block 114 may be implemented with a delay/area sensitivity based size optimization tool that balances the delays of all timing paths thereby minimizing total circuit area for a given performance. While these tools typically focus initially on only obviously undersized devices that were affected during the reduction in block 112, all devices in the integrated circuit are candidates for resizing and thus, excess area is distributed across all critical timing paths.

Following the area redistribution in block 114, the performance of the circuit is again determined in block 102. The optimization iteration continues until the performance constraints are met.

Figure 2A:
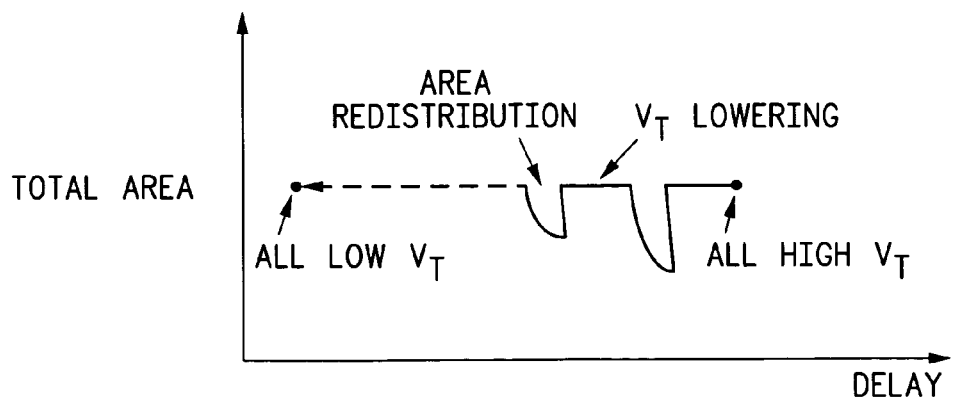
FIGS. 2A and 2B illustrate total area and total leakage as a function of delay for an integrated circuit implemented with varying ratios of low threshold transistors to high threshold voltage transistors, according to embodiments of the present invention.
Figure 2B:
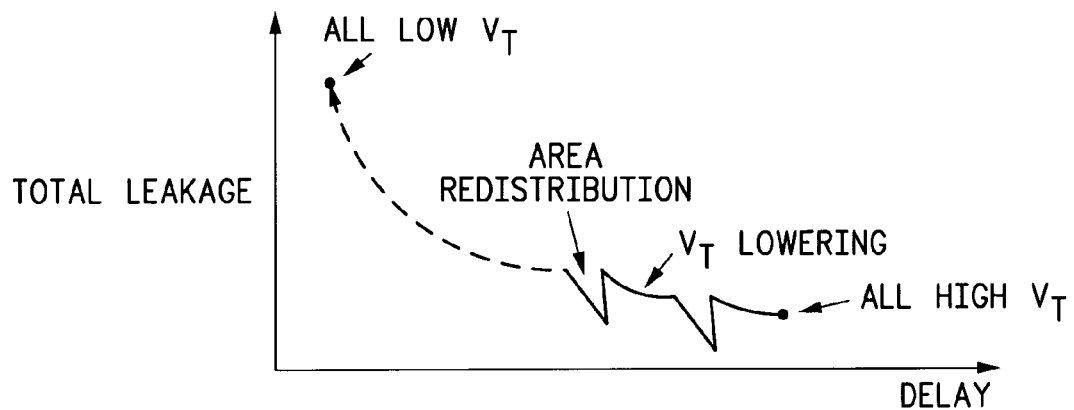

In one embodiment, the total area of the integrated circuit is predetermined and the circuit sizing in block 114 restores the area of the circuit to this predetermined area. In this manner, the integrated circuit area remains constant as the performance is improved through threshold voltage lowering on selected transistors. This approach to performance improvement is graphically illustrated in FIG. 2A, which plots the total area as a function of delay. The right most point of the plotted line represents the initial circuit model implemented with all transistors having the first (high) $V_t$. At each iteration, a transistor is selected for $V_t$ lowering (block 108), thereby decreasing circuit delay while the circuit area remains unchanged. After reducing the $V_t$ of a selected transistor, the resizing process includes initially decreasing the size of transistors (block 112) within the selected transistor's cone of influence (thereby resulting in a decrease in the total circuit area) and thereafter redistributing this area to further improve device performance (block 114) while increasing the circuit area. FIG. 2B illustrates the change in leakage as the circuit model is modified from an all high $V_t$ device model to an all low $V_t$ device model. This plot illustrates that the $V_t$ lowering (block 108) increases the leakage current and reduces circuit delay while the resizing of area following $V_t$ lowering, by decreasing the sizes of transistors within the selected transistor's cone of influence (block 112) and redistributing the area (block 114), usually has negligible net effect on the leakage but further reduces the circuit delay. The leakage is initially decreased after transistors in the cone of influence are shrunk, but the leakage increases again as the area saved by shrinking the transistors within the cone of influence is redistributed throughout the remainder of the circuit.

In one embodiment, calculating the ratio of the change in circuit delay to change in circuit leakage is optimized with an improved method of estimating leakage current of a given circuit model. Broadly speaking, this improved method of estimating leakage current includes: partitioning an integrated circuit into one or more units referred to herein as DC-connected components (DCC's); determining the dominant logic states (DLS's), as described in greater detail below, corresponding to each of the DCC's; calculating a leakage current for each of the dominant logic states; and calculating a DCC average leakage current by summing the various DLS leakage currents in a weighted fashion that takes the probability of each DLS into consideration.

Figure 5C:
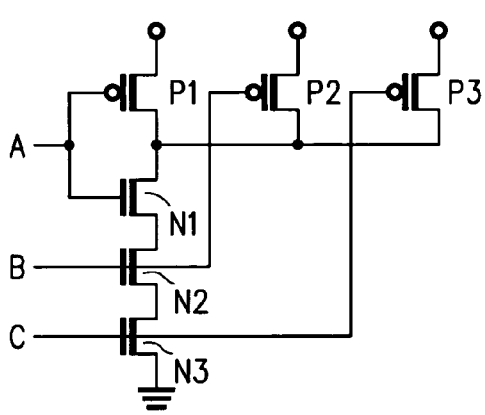
FIG. 5C is a table indicating leakage current and the transistors that have leakage current for each of the possible states of the NAND gate of FIGS. 5A and 5B.
Figure 5C:
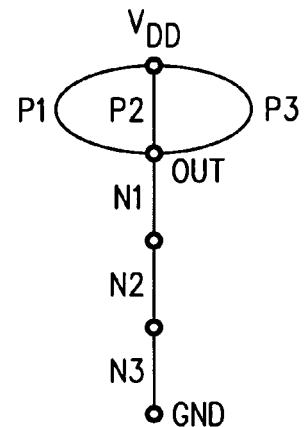

This method takes advantage of the reality that leakage of a gate varies significantly depending upon the gate's state. Because transistor leakage current is non-linearly dependent upon the drain-to-source voltage Vds, states in which more than one OFF transistor forms a path from Vdd to ground (i.e., Vdd is shared across two or more OFF transistors) are far less leaky than states in which one (or more) OFF transistors each shunt the full power supply voltage. These latter states are referred to herein as DLS's. Thus, a DLS refers to a state in which one or more transistors within an integrated circuit see a drain-to-source voltage of the first power supply when the transistor is off. The set of DLS's is usually small compared with the set of all possible states for a circuit of any significance. Referring to FIGS. 5A and 5B, alternative representations of a simple circuit are depicted. In FIG. 5B, a graphical representation of the circuit of FIG. 5A is generated by replacing the source/drain path of each transistor with an edge and eliminating the gate nodes. This representation is effective in emphasizing the current paths for subthreshold leakage. FIG. 5C presents a table of the leakage for each of the possible states of the circuit and the transistors across which leakage occurs in each state (i.e., the OFF transistors for which Vds>0). Inspection of FIG. 5C reveals that the significant majority of leakage current is attributable to states 011, 101, 110, and 111. In each of these states, Vds for at least one OFF transistor is (approximately) equal to Vdd. Thus, these states form the set of DLS's for this simple circuit. In the case of the 111 state, note that three OFF transistors (P1, P2, and P3) have a Vds of approximately Vdd thereby making this state the most dominant of the DLS's. FIG. 5C illustrates that the average leakage current of a circuit is dominated by the leakage current of the DLS's. Thus, an accurate estimate of the circuit's average leakage can be obtained by considering a subset of the circuit's possible states rather than attempting to estimate leakage for every possible state.

Figure 3:
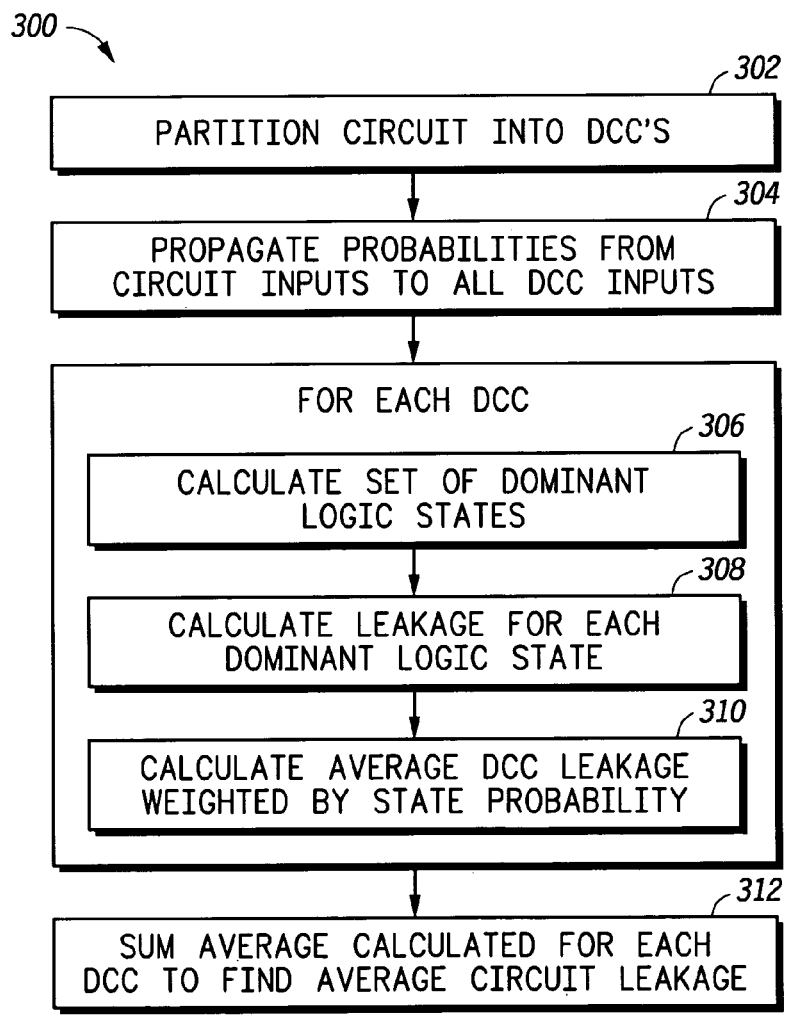
FIG. 3 is a flow diagram illustrating a method of calculating the average leakage current of an integrated circuit according to one embodiment of the invention.

Turning now to FIG. 3, a flow diagram illustrating a method 300 for estimating the leakage current of an integrated circuit is presented. In the depicted embodiment, the integrated circuit is initially partitioned into one or more DC-connected components (DCC's) as shown in block 302. A DCC is a component having a set of transistors coupled through a source or drain node from a power supply node. Each DCC is typically coupled to at least one power supply such as Vdd and is still more typically coupled to a second supply level such as ground (Vss or GND).

After partitioning the circuit model into a set of DCC's, probabilities may be assigned to each of the circuit model inputs. These input probabilities are then propagated (block 304) to calculate probabilities for the DCC inputs. From these probabilities, the probability that a particular DCC is in a particular state can be calculated. However, alternate embodiments may choose not to assign these probabilities. For example, alternate embodiments may assume each state has a same probability. In this case, block 304 would be removed from flow 300.

Each DCC is then analyzed to determine its DLS's in block 306 (as described in greater detail below). For each DLS discovered in block 306, the leakage current for that DLS is calculated in block 308. The DCC average leakage current is then calculated in block 310 by weighing each of the calculated DLS leakage currents by the probability that the DCC will be in that DLS. (If no probabilities were calculated, block 310 could simply calculate the average DCC leakage current without regards to the state probabilities or under the assumption that the state probabilites are all the same.) The average leakage current for the circuit is then determined in block 312 by summing the calculated average current for each of the DCC's. By selectively evaluating only those states that contribute most significantly to the leakage current, method 300 reduces the time required to calculate leakage current for a circuit without substantially reducing the accuracy or reliability of the estimate.

Figure 4:
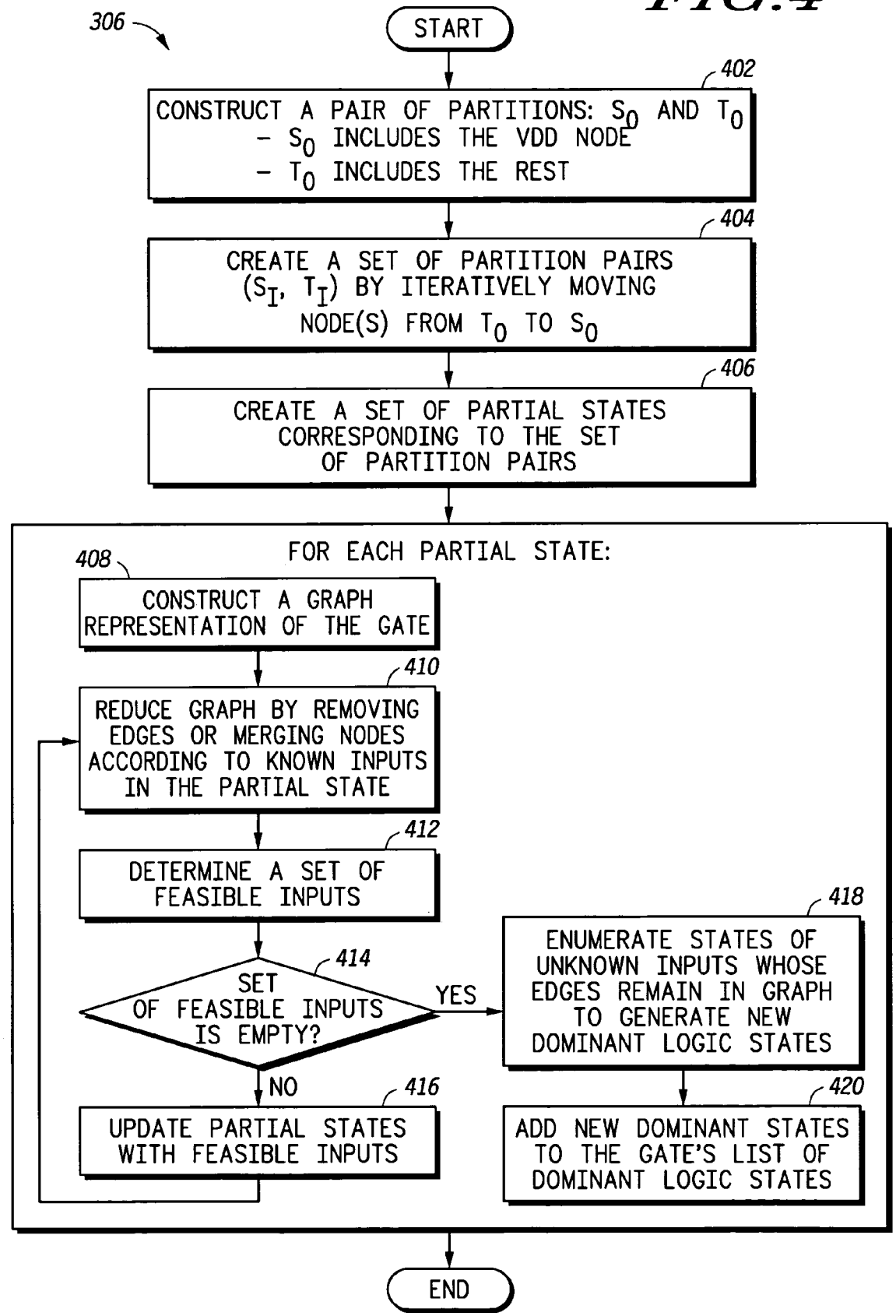
FIG. 4 is a flow diagram illustrating a method of determining the dominant logic states of a portion of an integrated circuit according to one embodiment of the invention.
Figure 6:
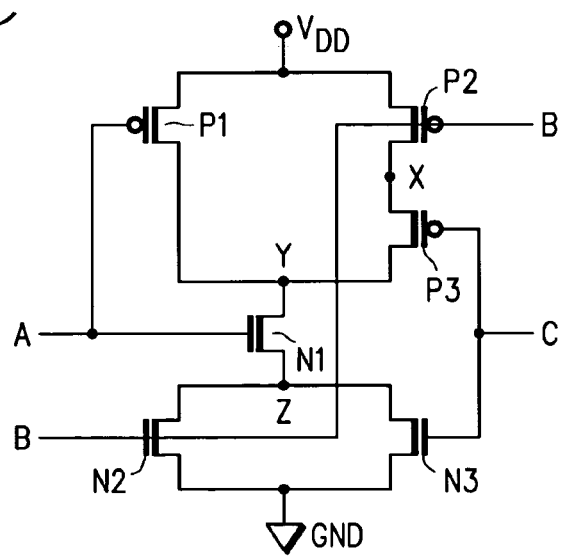
FIG. 6 is a circuit diagram of a DC-connected component (DCC) of an integrated circuit.
Figure 7A:
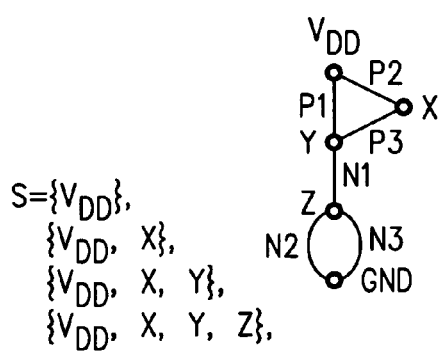
FIGS. 7A, 7B, 7C, and 7D are successive graphical representations illustrating a method for determining a dominant logic state of the DCC of FIG. 6.

Turning now to FIG. 4, a flow diagram illustrating a method 306 for determining a DLS of an integrated circuit according to one embodiment of the invention is presented. In the depicted embodiment, a DCC of the circuit is represented in a simplified fashion. Referring also to FIGS. 6 and 7A, an exemplary circuit diagram and the corresponding simplified representation suitable for determining DLS's are presented for purposes of illustrating method 306. The circuit representation (FIG. 7A) is used to determine a set of partition pairs $S_I$, $T_I$ for I=0 to N−1 and N represents the number of minimum partitions into which the circuit can be divided. A minimum partition, as used herein, refers to a partition of the circuit in which the circuit includes two connected components, one of which contains a first power supply node and the other of which contains a second power supply node. In one embodiment, the first power supply node may be the Vdd node, while the second power supply node may be the ground node.

The initial partition pair (S0, T0) may be defined as the partition in which S0 contains the Vdd node only and T0 contains all other nodes (including the ground node). This initial partition pair is constructed in block 402 and is indicated in FIG. 7A by the notation S={VDD}. This notation indicates that the set of minimum partition pairs includes a partition pair in which the S partition (the first partition) includes the Vdd node only. By definition of a minimum partition, the T partition (the second partition) contains all nodes not contained in the S partition. The set of minimum partitions is created (block 404) by iteratively moving nodes from the initial T partition to the S partition. Note that not all node groupings result in a minimum partition. The node pairing {Vdd, Y} for example is not included in the set S of partitions that produce minimum partitions of the circuit because isolating nodes Vdd and Y would require dividing the circuit into three partitions (i.e., {Vdd, Y}, {X}, and {Z, GND}). FIG. 7A illustrates that the set of minimum partitions is defined by the set of first partitions S where the elements of S are {Vdd}, {Vdd, X}, {Vdd, X, Y}, and {Vdd, X, Y, Z}. Thus, there are four minimum partitions of the circuit represented in FIG. 7A. Each partition in the set of minimum partitions is a candidate as a dominant logic state (DLS).

To determine if a minimum partition qualifies as a DLS, a partial state is created (block 406) for the partition pair. The partial state represents the states of the inputs required to form the partition. By way of example, the partition pair of S={Vdd, X, Y} T={Z, GND} is formed by removing from the FIG. 7A circuit representation the edge corresponding to the N1 transistor. Removing an edge from the circuit representation means turning OFF the transistor corresponding to the edge. Since transistor N1 is an NMOS device and the gate of N1 is connected to node A (as seen in FIG. 6), the partial state for this particular minimum partition is A=0. Having determined a partial state for the circuit, a graph of the DCC is constructed in block 408. Continuing with the example under consideration, the graph is then reduced (if possible) in block 410 by removing edges or merging nodes according to known inputs from the partial state.

Figure 7B:
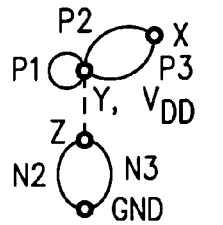

In one embodiment, reducing the graph in block 410 includes merging two nodes if the nodes are connected by an edge whose corresponding transistor is logically ON when the partial state is asserted and if the corresponding transistor is of the correct type. For the S partition (the partition containing the Vdd node), PMOS devices are of the correct type. For the T partition (the partition containing the GND node), NMOS devices are of the correct type. In the present example, the partial state of A=0 will turn ON transistor P1. Since P1 is a PMOS device in the S partition (i.e., P1 is of the correct type), the two nodes connected by the P1 edge (Vdd and Y) may be merged thereby eliminating the P1 edge. The state of the circuit representation at this point is depicted in FIG. 7B. Further reduction of the circuit representation is achieved after merging of the Vdd and Y nodes by removing any edge lying in a loop that has no edges in the path from Vdd to GND. As seen in FIG. 7B, the P1, P2, and P3 are all part of loops that contain no edges in the Vdd to GND path. Thus, each of these edges can be removed thereby resulting in the circuit representation of FIG. 7C.

Following the reduction of the circuit representation, a set of feasible inputs for the partial logic state is determined (block 412) for a transistor (edge) in the reduced representation whose input logic value is not defined. A feasible input is an input that will turn ON a transistor in the reduced representation without turning OFF any other transistor in the reduced representation. For the current example, a feasible assertion is B=1 since this assertion will turn ON N2 without turning OFF any transistors in the reduced representation.

Figure 7C:
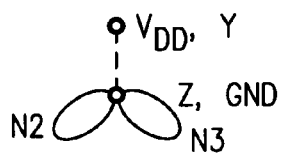
Figure 7D:
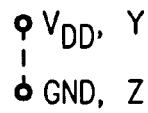

If a feasible assertion is determined, the partial state is updated (block 416) with the feasible input. Thus the partial-state in the example becomes A=0, B=1 (as illustrated in FIG. 7C). After updating the partial state, the circuit representation is further reduced by repeating blocks 410 and 412. If no feasible inputs are possible following block 412 (i.e., the set of feasible inputs is empty as determined in block 414), all possible states of unknown inputs whose edges remain in the circuit representation are enumerated (block 418) and combined with the known partial state to form a set of DLS's. If A=1 is a partial state and no feasible input for B or C is possible, the list of DLS's would include all states where A=1 (i.e., 100, 101, 110, and 111). After enumerating values for unknown inputs to generate DLS's these new DLS's are added to the list of DLS's for the circuit. If, following assertion of a feasible input, the representation is fully reduced (i.e. the circuit representation includes only the Vdd node and the GND node), unknown inputs will be left undefined in the current DLS. In the present example, following assertion of the B=1 feasible input, the circuit representation is fully reduced thereby leaving the input C in an unknown state (as illustrated in FIG. 7D). For this example, the DLS is the state 01X. Since the dominant logic states of a circuit are the primary contributors to the circuit's leakage, an estimate of the circuit's leakage can be calculated by calculating leakage of each dominant logic state.

Figure 8:
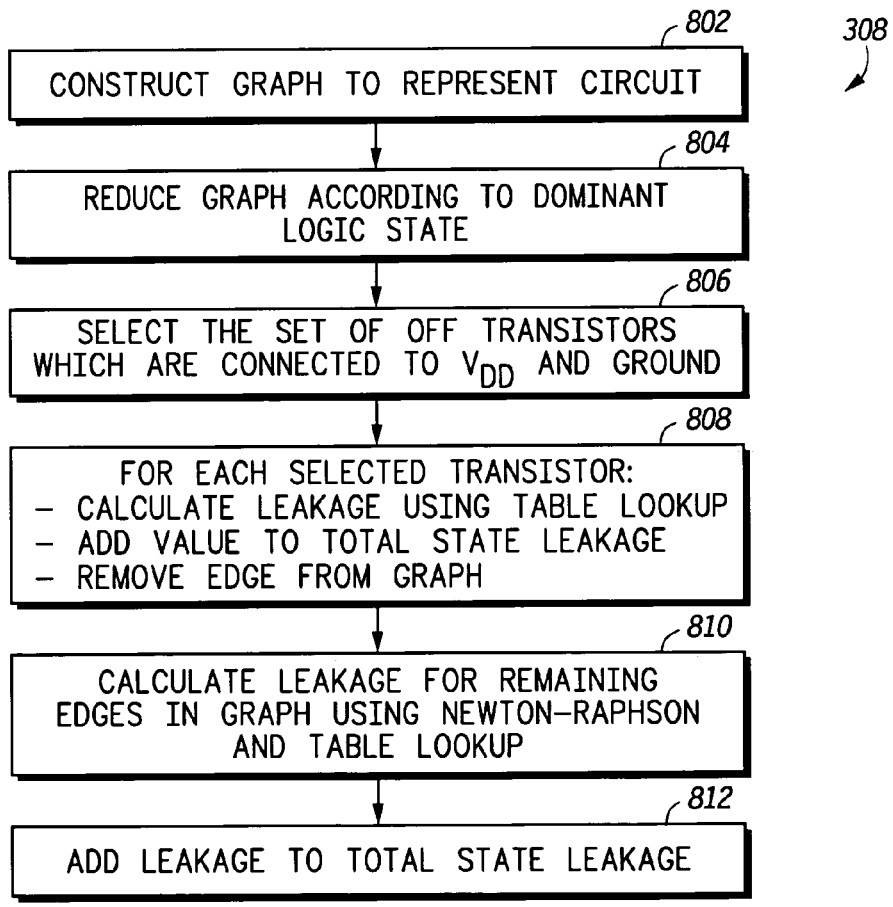
FIG. 8 is a flow diagram of a method for calculating the leakage current of a dominant logic state of a DCC.

One embodiment of the invention contemplates a method 308 for calculating the leakage current from a model of a DCC for a given DLS. FIG. 8 is a flow diagram illustrating one embodiment of such a method. Initially, a graphical representation (such as the representations depicted in FIG. 5B and FIG. 7A) of a circuit is constructed in block 802 (similar to block 408) by replacing transistors with edges that connect the source and drain nodes of the transistor. The graph is reduced (block 804) according to the known input logic values in the DLS. The graph reduction is done in the same fashion as described above for block 410. Then, a first set of transistors including all the fully leaking transistors is determined (block 806). A fully leaking transistor is an OFF transistor that is connected between Vdd and GND (i.e., a transistor for which $Vgs<V_t$ and $Vds \approx Vdd$). For each transistor in this first set of transistors, a leakage value is calculated (block 808). In one embodiment, the leakage value for each transistor in the first set of transistors is determined from a lookup table where the lookup table contains pre-determined leakage values for various transistor sizes and threshold voltages. In one embodiment, the transistor width and $V_t$ are used as inputs to the lookup table and the lookup table returns a leakage value. The use of a lookup table beneficially eliminates the need to use formal analytical tools to estimate leakage thereby reducing the time required to estimate leakage current. As a transistor's leakage is determined from the lookup table, the transistor's corresponding edge is removed from the graph. The leakage associated with each fully leaking transistor is added together to form an estimate of the leakage current attributable to the fully leaking transistors.

After leakage for each of the fully leaking transistors has been determined, leakage for the remaining transistors in the circuit may be calculated (block 810) using an analytical tool such as a Newton-Raphson technique for determining the roots of complex equations in order to determine the unknown node voltage (Vd or Vs) of the remaining transistors. The leakage of each remaining transistor is then determined from a lookup table where the lookup table contains predetermined leakage values for various transistor sizes, Vds values, and threshold voltages. The leakage determined for each of these remaining transistors is then added to the previously determined sum of leakage for the first set of transistors to obtain (block 812) an estimate of the total leakage for a DLS. Using this technique, an estimate of the circuit leakage for each DLS is then determined.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A computer implemented method for determining a dominant logic state in an integrated circuit, comprising:
   using a representation of the integrated circuit to determine a first partition and a second partition wherein the first partition includes a first power supply node and the second partition includes a second power supply node;
   determining a partial logic state corresponding to the first and second partitions;
   modifying the representation according to the partial logic state; and
   using the modified representation to determine the dominant logic state.

2. The method of claim 1, further comprising:
   determining a plurality of partition groups each having two partitions by iteratively moving at least one node From the second partition to the first partition;
   determining a partial logic state corresponding to each of the plurality of partition groups; and
   for each partial logic state, modifying the representation to determine at least one dominant logic state.

3. The method of claim 2, wherein the at least one node is not the second power supply node.

4. The method of claim 2, wherein modifying the representation includes at least one of removing edges and merging nodes according to known inputs of the partial logic state.

5. The method of claim 2, further comprising determining a first set of feasible inputs for each partial logic state, wherein:
   if the first set is empty, enumerating states of the unknown inputs whose edges remain in the representation after modifying the representation to determine the at least one dominant logic state, and
   if the first set is not empty, updating the partial logic states based on the feasible inputs.

6. The method of claim 5, further comprising:
   if the first set is not empty, modifying the graph representation and determining a second set of feasible inputs after updating the partial logic states.

7. The method of claim 5, wherein enumerating is performed to determine a plurality of dominant logic states.

8. The method of claim 1, wherein the dominant logic state corresponds to a transistor within the integrated circuit that sees a drain-to-source voltage of the first power supply when the transistor is off.

9. The method of claim 1, wherein the representation is a graph representation comprising nodes and edges.

10. The method of claim 9, wherein modifying the graph representation includes at least one of removing edges and merging nodes according to known inputs of the partial state.

11. The method of claim 1, wherein the integrated circuit is a DC-connected component (DCC).

12. A computer implemented method for determining a leakage current of an integrated circuit, comprising:
   partitioning the integrated circuit into at least one DC-connected component (DCC);
   determining a dominant logic state corresponding to the at least one DCC; and
   calculating a leakage current for the at least one DCC corresponding to the dominant logic state.

13. The method of claim 12, wherein determining is further characterized as determining a set of dominant logic states corresponding to the at least one DCC.

14. The method of claim 13, wherein calculating comprises calculating a leakage current corresponding to each dominant logic state within the set of dominant logic states.

15. The method of claim 12, wherein the DCC includes at least one input, the method further comprising:
   determining a probability corresponding to the at least one input; and
   using the probability and the leakage current to calculate an average DCC leakage current.

16. The method of claim 15, wherein the integrated circuit is partitioned into a plurality of DCCs, each DCC including at least one input, the method further comprising:
   determining a set of dominant logic states corresponding to each of the plurality of DCCs;
   calculating a leakage current corresponding to each dominant logic state within each set of dominant logic states;
   determining a probability corresponding to the at least one input of each DCC;
   using the corresponding probability and the corresponding leakage current to calculate an average DCC leakage current for each DCC; and
   calculating an average circuit leakage for the integrated circuit using the average DCC leakage currents.

17. The method of claim 12, wherein the integrated circuit is partitioned into a plurality of DCCs, the method further comprising:
   determining a set of dominant logic states corresponding to each of the plurality of DCCs;
   calculating a leakage current corresponding to each dominant logic state within each set of dominant logic states; and
   calculating an average circuit leakage for the integrated circuit.

18. The method of claim 12, wherein:
   the at least one DCC is coupled to a first power supply; and
   the dominant logic state corresponds to a transistor within the DCC that sees a drain-to-source voltage of the first power supply when the transistor is off.

19. The method of claim 12, wherein determining the dominant logic state corresponding to the at least one DCC comprises:
   using a representation of the DCC to determine a first partition and a second partition wherein the first partition includes a first power supply node and the second partition includes a second power supply node;
   determining a partial logic state corresponding to the first and second partitions;
   modifying the representation according to the partial logic state; and
   using the modified representation to determine the dominant logic state.

20. The method of claim 12, wherein calculating the leakage current for the at least one DCC corresponding to the dominant logic state comprises:
   constructing a graph having nodes and edges according to the dominant logic state of the integrated circuit;
   calculating a leakage for each transistor in a first set of transistors;
   modifying the graph based on the first set of transistors;
   calculating a leakage for each transistor in a second set of transistors; and
   calculating the leakage current for the at least one DCC using the leakages for the transistors in the first set of transistors and the leakages for the transistors in the second set of transistors.

21. A computer implemented method of improving performance of an integrated circuit, comprising:
for each transistor of the integrated circuit having a first threshold voltage level, calculating a first value based at least in part on delay and leakage corresponding to a second threshold voltage level, wherein calculating the first value comprises:
partitioning the integrated circuit into at least one DC-connected component (DCC);
determining a dominant logic state corresponding to the at least one DCC; and
calculating a leakage current for the at least one DCC corresponding to the dominant logic state;
selecting one of the transistors of the integrated circuit based on the first values;
setting the selected one of the transistors to the second threshold voltage level; and
modifying an area of at least one transistor within the integrated circuit.

22. The method of claim 21, further comprising determining a cone of influence of the selected one of the transistors wherein the at least one transistor is within the cone of influence.

23. The method of claim 22, wherein the selected one of the transistors and the at least one transistor is a same transistor.

24. The method of claim 22, wherein modifying includes modifying an area of each transistor within the cone of influence.

25. The method of claim 21, further comprising:
sizing the integrated circuit to a predetermined area after modifying the area of the at least one transistor.

26. The method of claim 25, further comprising determining a cone of influence of the selected one of the transistors, wherein modifying includes modifying an area of each transistor within the cone of influence.

27. The method of claim 25, wherein the integrated circuit has a first area prior to calculating the first values and the predetermined area approximately equals the first area.

28. The method of claim 25, further comprising:
determining a circuit performance;
if the circuit performance is below a predetermined performance level, repeating calculating the first values, selecting one of the transistors, setting the selected one of the transistors, modifying the area of the at least one transistor, and sizing the integrated circuit.

29. The method of claim 21, further comprising:
determining a circuit performance;
if the circuit performance is below a predetermined performance level, repeating calculating the first values, selecting one of the transistors, setting the selected one of the transistors, and modifying the area of the at least one transistor.

30. An improved integrated circuit manufactured using the method of claim 21.

31. A computer implemented method for calculating a leakage current of an integrated circuit, comprising:
constructing a graph having nodes and edges according to a dominant logic state of the integrated circuit;
calculating a leakage for each transistor in a first set of transistors;
modifying the graph based on the first set of transistors; and
calculating a leakage current for each transistor in a second set of transistors.

32. The method of claim 31, wherein the integrated circuit is a DC-connected component (DCC).

33. The method of claim 31, wherein constructing the graph comprises modifying the graph according to a dominant logic state of the integrated circuit.

34. The method of claim 31, wherein the first set of transistors includes transistors of the integrated circuit that are off and are coupled to both a first power supply node and a ground node.

35. The method of claim 34, wherein calculating the leakage for each transistor in the first set of transistors is performed using a lookup table.

36. The method of claim 35, wherein calculating the leakage for each transistor in the second set of transistors comprises:
calculating a node voltage; and
using a lookup table.

37. The method of claim 31, wherein modifying the graph includes removing from the graph an edge corresponding to each of the transistors in the first set of transistors.

38. The method of claim 31, wherein the first set of transistors and the second set of transistors are mutually exclusive.

39. The method of claim 31, further comprising calculating a leakage current of the integrated circuit by summing the leakages for the transistors in the first set and the leakages for the transistors in the second set.

40. A program stored on a computer readable medium including a plurality of computer executable instructions which when executed on a computer performs a process for determining a dominant logic state in an integrated circuit, the program comprising:
a first plurality of instructions for receiving a representation of an integrated circuit;
a second plurality of instructions for determining a first partition and a second partition wherein the first partition includes a first power supply node and the second partition includes a second power supply node;
a third plurality of instructions for determining a partial logic state corresponding to the first and second partitions;
a fourth plurality of instructions for modifying the representation according to the partial logic state; and
a fifth plurality of instructions for using the modified representation to determine the dominant logic state.

41. A program stored on a computer readable medium including a plurality of computer executable instructions which when executed on a computer performs a process for determining a leakage current of an integrated circuit, the program comprising:
a first plurality of instructions for partitioning an integrated circuit into at least one DC-connected component (DCC);
a second plurality of instructions for determining a dominant logic state corresponding to the at least one DCC; and
a third plurality of instructions for calculating a leakage current for the at least one DCC corresponding to the dominant logic state.

42. A computer readable medium having stored therein a program comprising instructions which when executed on a computer perform a process for improving performance of an integrated circuit having a plurality of transistors, each of the plurality of transistors having a first threshold voltage level, comprising:

a first plurality of instructions for calculating a first value based at least in part On delay and leakage corresponding to a second voltage level for each of the plurality of transistors, wherein calculating the first value comprises:
  partitioning the integrated circuit into at least one DC-connected component (DCC);
  determining a dominant logic state corresponding to the at least one DCC; and
  calculating a leakage current for the at least one DCC corresponding to the dominant logic state;
a second plurality of instructions for selecting one of the plurality of transistors based on the first values;
a third plurality of instructions for setting the selected one of the transistors to the second threshold voltage; and
a fourth plurality of instructions for modifying an area of at least one transistor within the integrated circuit.

43. A program stored on a computer readable medium including a plurality of computer executable instructions which when executed on a computer performs a process for calculating a leakage current of an integrated circuit, the program comprising:
  a first plurality of instructions for receiving a graph having nodes and edges according to a dominant logic state of an integrated circuit;
  a second plurality of instructions for calculating a leakage for each transistor in a first set of transistors;
  a third plurality of instructions for modifying the graph based on the first set of transistors; and
  a fourth plurality of instructions for calculating a leakage current for each transistor in a second set of transistors.

* * * * *